United States Patent
Kim

(10) Patent No.: US 11,600,338 B2
(45) Date of Patent: Mar. 7, 2023

(54) MEMORY DEVICE AND METHOD OF OPERATING THE MEMORY DEVICE

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 36 days.

(21) Appl. No.: 17/208,711

(22) Filed: Mar. 22, 2021

(65) Prior Publication Data
US 2022/0093183 A1    Mar. 24, 2022

(30) Foreign Application Priority Data

Sep. 22, 2020 (KR) .................. 10-2020-0122029

(51) Int. Cl.
*G11C 16/26* (2006.01)
*G11C 16/14* (2006.01)
*G11C 16/10* (2006.01)
*G11C 7/10* (2006.01)
*G11C 16/30* (2006.01)
*G11C 16/34* (2006.01)
*G11C 16/24* (2006.01)

(52) U.S. Cl.
CPC ............ *G11C 16/26* (2013.01); *G11C 7/1039* (2013.01); *G11C 7/1048* (2013.01); *G11C 16/102* (2013.01); *G11C 16/14* (2013.01); *G11C 16/24* (2013.01); *G11C 16/30* (2013.01); *G11C 16/3409* (2013.01)

(58) Field of Classification Search
CPC ..... G11C 16/26; G11C 7/1039; G11C 7/1048; G11C 16/102; G11C 16/14; G11C 16/24; G11C 16/30; G11C 16/3409; G11C 16/32; G11C 16/0483; G11C 16/08; G11C 16/10; G11C 16/3404
See application file for complete search history.

(56) References Cited

U.S. PATENT DOCUMENTS

| | | | |
|---|---|---|---|
| 2008/0123432 A1* | 5/2008 | Kim ................ | G11C 16/26 365/185.25 |
| 2019/0043584 A1* | 2/2019 | Park ................ | G11C 11/5671 |

FOREIGN PATENT DOCUMENTS

| | | |
|---|---|---|
| KR | 101039884 B1 | 6/2011 |
| KR | 1020160052278 A | 5/2016 |

* cited by examiner

*Primary Examiner* — Jay W. Radke
(74) *Attorney, Agent, or Firm* — William Park & Associates Ltd.

(57) ABSTRACT

The present technology relates to an electronic device. A memory device configured to perform a sensing operation based on a charge degree of a sensing node includes a memory cell array including a plurality of memory cells, a peripheral circuit including a page buffer connected to a selected memory cell among the plurality of memory cells through a bit line, and configured to perform a sensing operation on the selected memory cell, and control logic configured to control the peripheral circuit to precharge a source line among lines connected to the memory cell array and perform the sensing operation based on a degree at which a sensing node in the page buffer is charged, during the sensing operation.

19 Claims, 13 Drawing Sheets

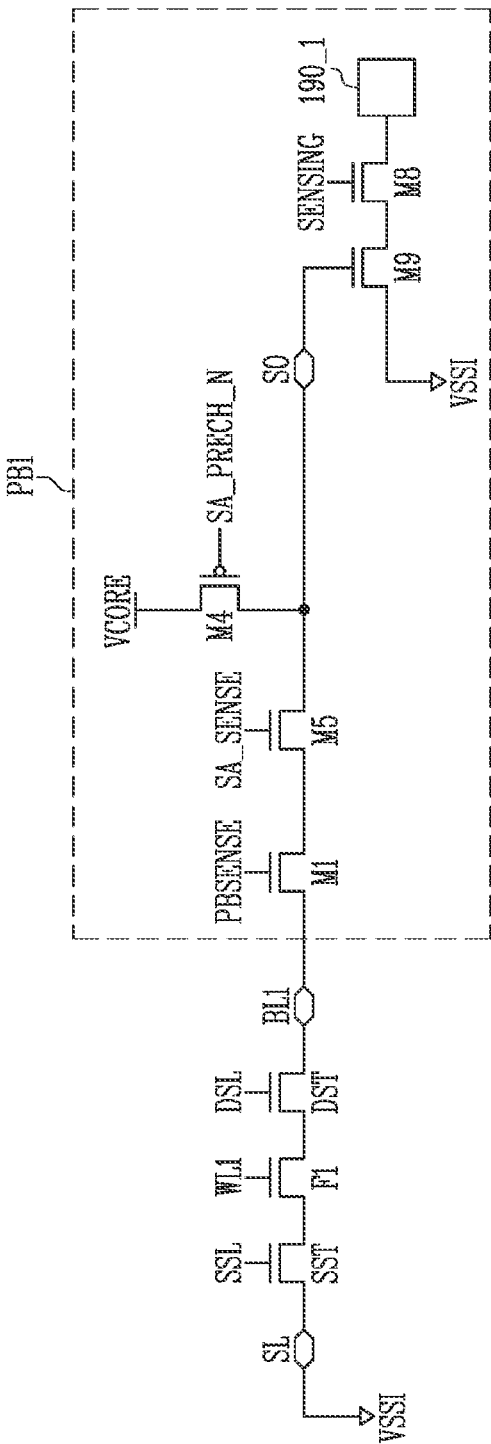
FIG. 5A
FIG. 5B
| SL | SSL | WL1 | DSL | BL1 | PBSENSE | SA_PRECH_N | SO |
|---|---|---|---|---|---|---|---|
| 0V | VSSL | VREAD | VDSL | 0.4V | 0.4V+VT | 0V | VCORE |
| SA_PRECH_N | SO |
|---|---|
| VSAPRECHN | VCORE~0V |

# MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0122029, filed on Sep. 22, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a nonvolatile memory.

The storage device may include a memory device in which data is stored and a memory controller that stores data in the memory device. The memory device may be classified into a volatile memory and a nonvolatile memory. Here, the nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM) and the like.

SUMMARY

A memory device according to an embodiment of the present disclosure may include a memory cell array including a plurality of memory cells, a peripheral circuit including a page buffer connected to a selected memory cell among the plurality of memory cells through a bit line, and configured to perform a sensing operation on the selected memory cell, and a control logic configured to control the peripheral circuit to precharge a source line among lines connected to the memory cell array and perform the sensing operation based on a degree at which a sensing node in the page buffer is charged, during the sensing operation.

A method of operating a memory device according to an embodiment of the present disclosure may include precharging a source line among lines connected to a memory cell array, applying a sensing voltage to a selected word line connected to a selected memory cell included in the memory cell array among the lines, and sensing the selected memory cell based on a degree at which a sensing node in a page buffer connected to the selected memory cell through a bit line is charged.

BRIEF DESCRIPTION OF THE DRAWINGS

FIGS. 5A and 5B illustrate a circuit configuration and magnitudes of signals when a sensing operation is performed based on a discharge degree of a sensing node.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

Hereinafter, embodiments of the present disclosure will be described with reference to the accompanying drawings.

An embodiment of the present disclosure provides a memory device that performs a sensing operation based on a charge degree of a sensing node, and a method of operating the same.

According to the present technology, bouncing of a source line current may be prevented by performing a sensing operation based on a charge degree of a sensing node.

Figure 1:
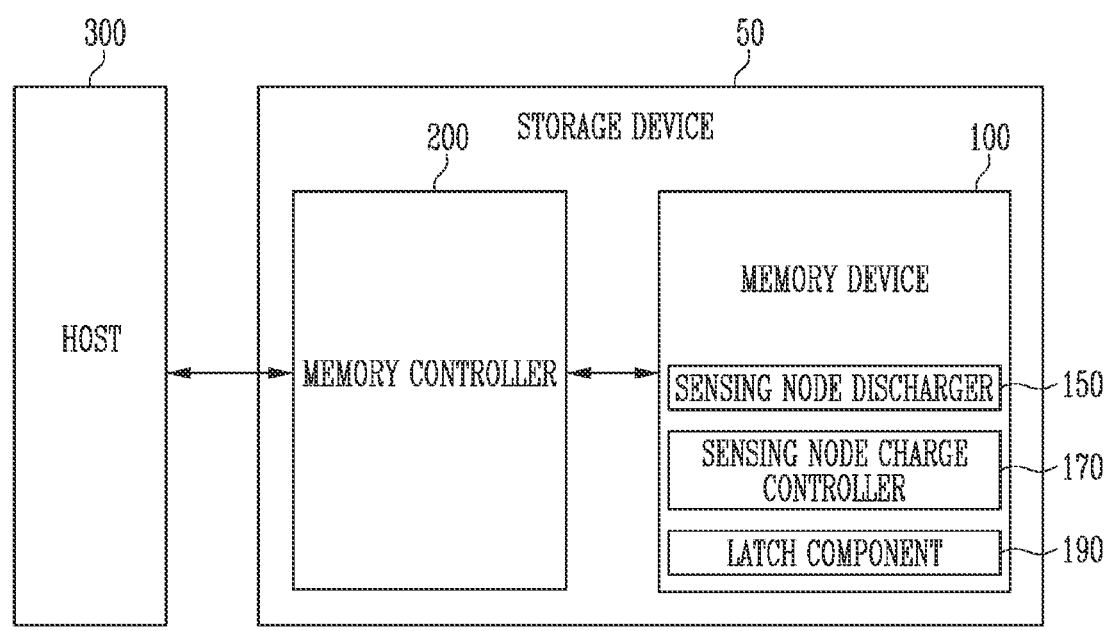
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

In an embodiment, during a sensing operation, the memory device 100 may perform the sensing operation based on a degree at which a sensing node is discharged after precharging a bit line and a sensing node. At this time, the sensing operation may be a verify operation or a read operation among operations included in a program loop, and the sensing node may be a node connecting the bit line and a latch in which data is stored.

However, the above method may have a problem in that a potential of the bit line might not be increased due to a limit of an amount of current that may flow through the memory device 100. In addition, when sensing memory cells programmed in a low state, bouncing of a source line may occur as a current flows from the bit line to the source line.

Therefore, due to the above problem, a method of performing the sensing operation based on a degree at which the sensing node is charged after discharging the bit line and the sensing node is presented.

In an embodiment, the memory device 100 may include a sensing node discharger 150. The sensing node discharger 150 may discharge the sensing node in a page buffer before the memory device 100 performs the sensing operation. In an embodiment, the sensing node discharger 150 may be configured of an NMOS or PMOS transistor. In addition, the sensing node discharger 150 may be configured of a plurality of sensing node discharge circuits, and each sensing node discharge circuit may be included in each page buffer included in a page buffer group.

In an embodiment, the memory device 100 may include a sensing node charge controller 170. The sensing node charge controller 170 may control an operation for charging the sensing node after the sensing node is discharged during the sensing operation. That is, a current path may be formed so that a current flows from the bit line to the sensing node.

For example, the sensing node charge controller 170 may precharge the source line, precharge the bit line according to a program state of a memory cell on which the sensing operation is performed, and set a voltage applied to a gate of a transistor connected to the bit line and the sensing node.

In an embodiment, the memory device 100 may include a latch component 190. The latch component 190 may sense data according to the degree at which the sensing node is charged and store the sensed data. In addition, the latch component 190 may be configured of a plurality of latches, and each latch may be included in each page buffer included in the page buffer group.

The memory controller 200 may control an overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may converts the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown), Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store program codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (DDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
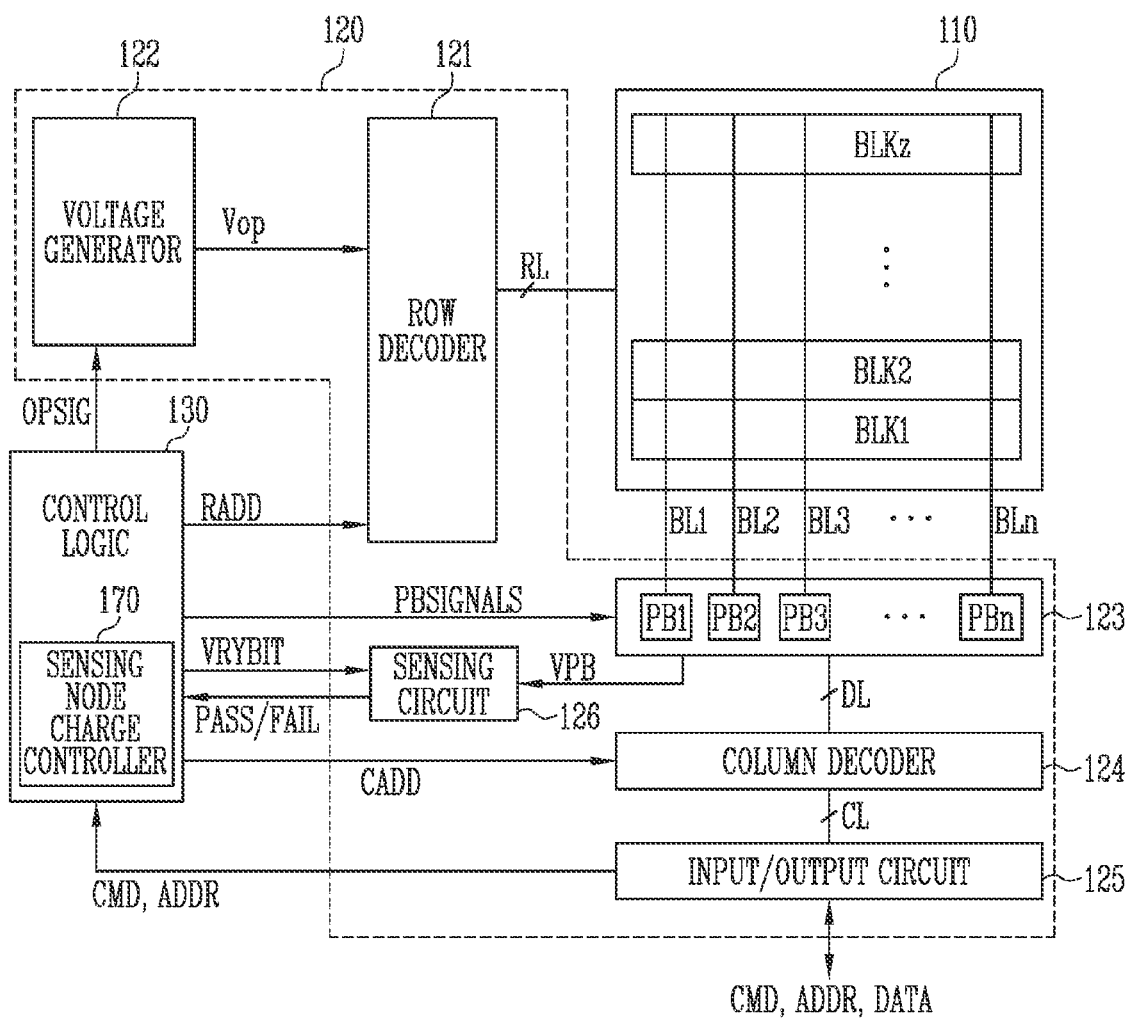
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL, The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block to apply the voltages generated by the voltage generator 122 to at least one word line WL according to the decoded address.

For example, during the program operation, the row decoder 121 may apply a program voltage to a selected word line and apply a program pass voltage of a level lower than that of the program voltage to an unselected word line. During a program verify operation, the row decoder 121 may apply a verify voltage to the selected word line and a verify pass voltage of a level higher than that of the verify voltage to the unselected word line. During the read operation, the row decoder 121 may apply a read voltage to the selected word line and apply a read pass voltage of a level higher than that of the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. For example, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130, For example, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

For example, during the program operation, when the program voltage is applied to the selected word line, the first to n-th page buffers PB1 to PBn may transfer data DATA received through the input/output circuit 125 to the selected memory cells through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation is passed or failed in response to the pass signal PASS or the fail signal FAIL.

In an embodiment, the memory device 100 may include a configuration for performing the sensing operation based on the degree at which the sensing node is charged. At this time, the sensing operation may be the verify operation or the read operation among the operations included in the program loop, and the sensing node may be the node connecting the bit line and the latch in which data is stored.

For example, the control logic 130 may include the sensing node charge controller 170. During the sensing operation, the sensing node charge controller 170 may control a signal applied to a gate of each transistor included in the page buffer in order to charge the sensing node after the sensing node is discharged.

For example, after the sensing node is discharged, the sensing node charge controller 170 may precharge the source line and control a voltage applied to the gate of the transistor connected to the bit line and the sensing node.

In addition, each of the first to n-th page buffers PB1 to PBn included in the page buffer group 123 may include any one of first to n-th sensing node discharge circuits and any one of first to n-th latches. In an embodiment, the first to n-th page buffers PB1 to PBn may discharge the sensing nodes through first to n-th discharge circuits, respectively, before performing the sensing operation. Thereafter, when the sensing node is discharged, the sensing node may be charged, Here, data sensed based on the degree at which the sensing node is charged may be stored in the first to n-th page buffers PB1 to PBn.

Figure 3:
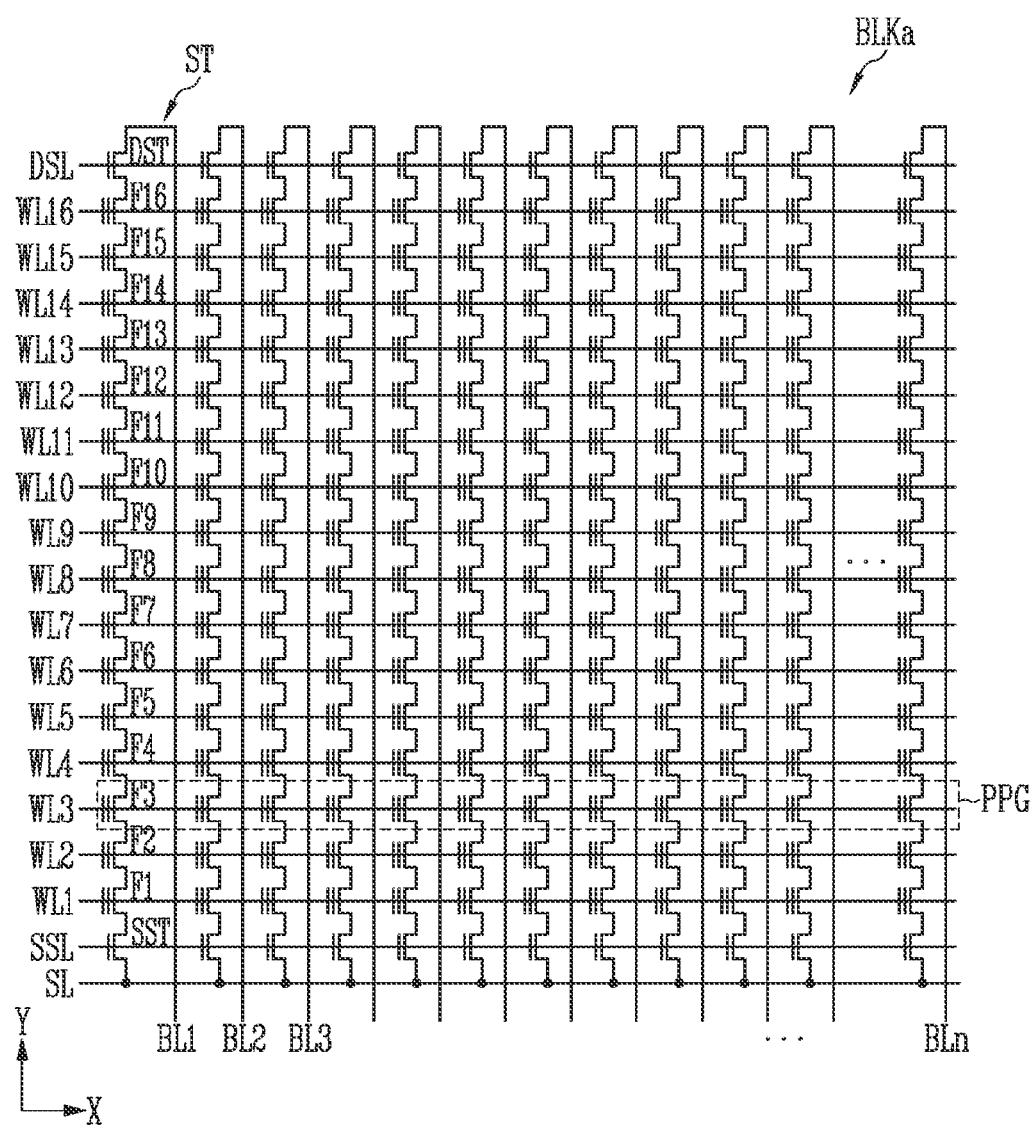
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

For example, the memory block BLKa may Include a plurality of strings connected between the bit lines BL1 to BLn and a source line SL. The bit lines BL1 to BLn may be connected to the strings, respectively, and the source line SL may be commonly connected to the strings. Since the strings may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multilevel cell (MLC). In this case, one physical page PPG may store two or more logical page (LPG) data.

A memory cell in which two or more bits of data are stored in one memory cell is referred to as the MLC, but recently, as the number of bits of data stored in one memory cell increases, the MLC refers to a memory cell in which two bits of data is stored, a memory cell in which three or more bits of data are stored is referred to as a triple level cell (TLC), and a memory cell in which four or more bits of data are stored is referred to as a quadruple level cell (QLC). In addition, a memory cell method in which a plurality of bits of data are stored has been developed, and the present embodiment may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
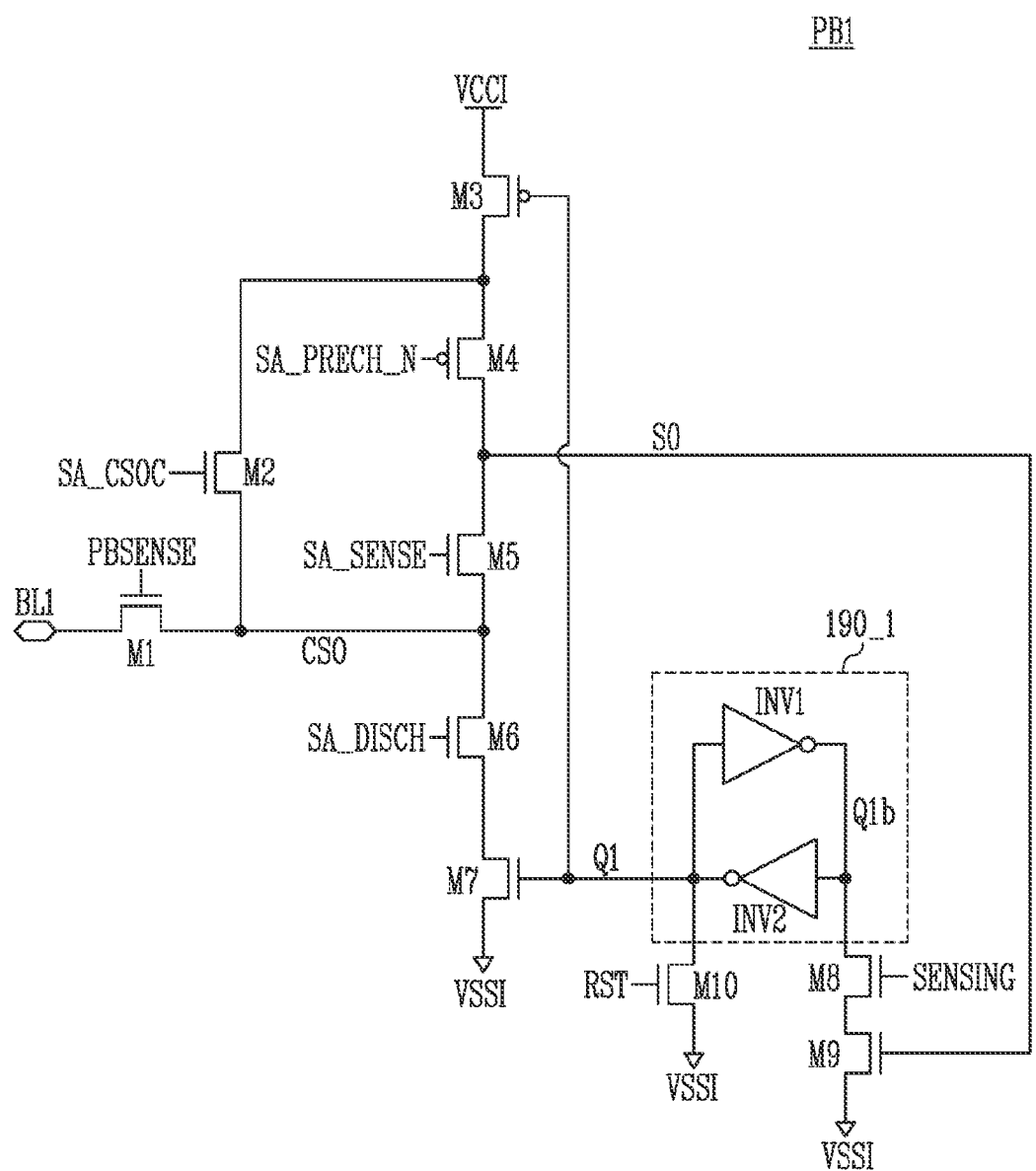
FIG. 4 is a diagram illustrating components of a page buffer connected to a bit line.

FIG. 4 is a diagram illustrating components of a page buffer connected to a bit line.

Referring to FIGS. 2 and 4, FIG. 4 illustrates the first page buffer PB1 among the plurality of page buffers PB1 to PBn of FIG. 2. Each of the second to n-th page buffers PB2 to PBn may also be configured with the same components as in FIG. 4.

In an embodiment, the first page buffer PB1 may be connected to a first memory cell MC1 through the first bit line BL1, and may perform a bit line precharge (BL precharge) operation of charging a charge, which is supplied from an internal power voltage VCCI through first to fifth transistors M1 to M5, in the first bit line BL1. At this time, the first transistor M1 is controlled by a first sense signal PBSENSE, the second transistor M2 is controlled by a first precharge signal SA_CSOC, and the third transistor M3 is controlled by a first latch 190_1. In addition, the fourth transistor M4 is controlled by a second precharge signal SA_PRECH_N, and the fifth transistor M5 is controlled by a second sense signal SA_SENSE.

In addition, the first page buffer PB1 may discharge the charge charged in the first bit line BL1 to an internal ground voltage VSSI through the first transistor M1, a sixth transistor M6, and a seventh transistor M7. The sixth transistor M6 is controlled by a first discharge signal SA_DISCH, and the seventh transistor M7 is controlled by the first latch 1901.

In an embodiment, the first page buffer PB1 may include the first latch 190_1 including a first inverter INV1 and a second inverter INV2. The first latch 190_1 may control the bit line precharge (BL precharge) operation by turning on or turning off the third transistor M3 through a first queue node Q1. A first queue bar node Q1b and the first queue node Q1 have inverted values. In an embodiment, the first queue bar node Q1b has an inverted value of the value at the first queue node Q1.

During a sensing operation on the first memory cell MC1, a voltage of the sensing node SO is determined based on a threshold voltage of the first memory cell MC1. The first latch 190_1 may store a result of sensing the threshold voltage of the first memory cell MC1 through a ninth transistor M9 connected to the sensing node SO. At this time, the ninth transistor M9 may be an n-type MOS transistor, and the sensing node SO may be connected to a gate node of the ninth transistor M9. A tenth transistor M10 is coupled between the first queue node Q1 and the internet ground voltage VSSI. In an embodiment, the tenth transistor M10 may be an n-type MOS transistor and may be configured to receive a reset signal RST at its gate. An eight transistor M8 may be coupled between the ninth transistor M9 and the first queue bar node Q1b. In an embodiment, the eight transistor M8 may be configured to receive a sensing signal SENSING. A common sensing node CSO may be coupled between the first transistor M1, the second transistor M2, the fifth transistor M5 and the sixth transistor M6.

Therefore, when the threshold voltage of the first memory cell MC1 is low, the sensing node SO may be low and the ninth transistor M9 may be turned off during the sensing operation. When the threshold voltage of the first memory cell MC1 is high, the sensing node SO may be high and the ninth transistor M9 may be turned on during the sensing operation.

In an embodiment, each of the first inverter INV1 and the second inverter INV2 included in the first latch 190_1 is connected to the internal power voltage VCCI and the internal ground voltage VSSI.

FIGS. 5A and 5B illustrate a circuit configuration and magnitudes of signals when a sensing operation is performed based on a discharge degree of a sensing node.

Referring to FIGS. 3, 4, 5A and 5B, FIG. 5A shows transistors connected between the source line SL and the first bit line BL1 based on the first bit line BL1, and a portion of a configuration of the first page buffer PB1 connected through the first bit line BL1, and FIG. 5B shows a magnitude of a signal applied to the transistors of FIG. 5A, and a potential of each node.

In FIG. 5A and FIG. 5B, voltages applied to the source select line SSL, the first word line WL1, and the drain select line DSL may be generated by the voltage generator 122 of FIG. 2 according to the operation signal OPSIG output from the control logic 130 of FIG. 2. That is, the voltage generator 122 of FIG. 2 may generate various operation voltages used for the sensing operation in response to the operation signal OPSIG.

Furthermore, in FIG. 5A and FIG. 5B, according to the operation signal OPSIG output from the control logic (130 of FIG. 2), the voltage generator 122 of FIG. 2 may be generate the PBSENSE signal and the SA_PRECH_N signal.

In FIG. 5A, it is assumed that the first memory cell F1 among the plurality of memory cells F1 to F16 connected to the string ST of FIG. 4 is a selected memory cell. In addition, in FIG. 5A, it is assumed that the second to sixteenth memory cells F2 to F16, unselected memory cells among the plurality of memory cells F1 to F16, are omitted from FIG. 5A.

Referring to FIG. 5A, a selected word line to which the first memory cell F1, which is the selected memory cell, is connected is the first word line WL1, and the first memory cell F1 may be connected between the drain select transistor DST and the source select transistors SST. Here, a line to which a gate of the drain select transistor DST is connected may be the drain select line DSL, and a line to which a gate of the source select transistor SST is connected may be the source select line SSL.

In an embodiment, the first bit line BL1 may be connected to a drain side of the drain select transistor DST, and the source line SL may be connected to a source side of the source select transistor SST.

The first memory cell F1 may be connected to the first page buffer PB1 through the first bit line BL1. It is assumed that a portion of the configuration of the first page buffer PB1 of FIG. 5A is omitted from FIG. 5A.

In an embodiment, the sensing operation may be performed on the first memory cell F1 that is the selected memory cell. At this time, the sensing operation may be the verify operation or the read operation among the operations included in the program loop, and the sensing node SO sensed in the sensing operation may be the node connecting the bit line and the latch in which data is stored. It is assumed that the sensing operation described in the present drawing is the read operation.

During the sensing operation, when a threshold voltage of the selected memory cell is lower than the read voltage, the selected memory cell may be turned on, and when the threshold voltage of the selected memory cell is higher than the read voltage, the selected memory cell may be turned off. In an embodiment, when the selected memory cell is turned off, it may be determined that the selected memory cell is in a program state, and when the selected memory cell is turned on, it may be determined that the selected memory cell is in an erase state.

Referring to FIG. 5B, when the memory device 100 of FIG. 1 performs the sensing operation on the first memory cell F1 which is the selected memory cell, a read voltage VREAD may be applied to the first word line WL1 to which the first memory cell F1 is connected. In another embodiment, when the sensing operation on the first memory cell F1 is the verify operation, a verify voltage VVERIFY may be applied to the first word line WL1.

At this time, in order to sense the first memory cell F1, a VDSL voltage for turning on the drain select transistor DST may be applied to the drain select line DSL connecting the gate of the drain select transistor DST connected to the first memory cell F1. In addition, a VSSL voltage for turning on the source select transistor SST may be applied to the source select line SSL connecting the gate of the source select transistor SST connected to the first memory cell F1. Furthermore, as a potential of the source line SL is set to 0V (ground voltage), a current path may be formed so that a current flows from the first bit line BL1 to the source line SL.

In an embodiment, the memory device 100 of FIG. 1 may set a magnitude of the PBSENSE signal applied to a gate of the first transistor M1 to 0.4V+VT (a magnitude of the threshold voltage of the first transistor M1), the first bit line BL1 may be precharged to 0.4V. In addition, by setting the SA_PRECH_N signal applied to a gate of the fourth transistor M4 to 0V, the fourth transistor M4 may be turned on and the sensing node SO may be precharged to VCORE. In an embodiment, VCORE may be 0.4V.

Thereafter, during the sensing operation, the memory device 100 of FIG. 1 may apply the second sense signal SA_SENSE that turns on the fifth transistor M5 to a gate of the fifth transistor M5. That is, the memory device 100 of FIG. may turn on the fifth transistor M5 only when performing the sensing operation, and thus the potential of the first bit line BL1, which is varied, may be reflected in the sensing node SO.

In addition, during the sensing operation, data may be sensed according to a value at which a magnitude of the potential of the sensing node SO is varied in VCORE. For example, since the ninth transistor M9 is turned on or turned off according to the potential of the sensing node SO, the data may be sensed based on the discharge degree of the sensing node SO.

When the first memory cell F1 is a programmed memory cell, the magnitude of the potential of the sensing node SO may be a value close to VCORE, and may have a value (ex. VCORE−0.1V) somewhat lower than VCORE. When the first memory cell F1 is a memory cell on which program is not performed or a memory cell on which program is not completed, the magnitude of the potential of the sensing node SO may be a value close to 0V, and may have a value (ex. 0.1V) somewhat higher than 0V.

Referring to FIG. 5A and FIG. 5B, the potential of the sensing node SO is varied between VCORE and 0V according to the program state of the memory cell, and information stored in the first latch 190_1 may be changed based on the variation of the potential of the sensing node SO. That is, data may be stored in the first latch 190_1 according to the variation of the potential of the sensing node SO.

However, when the memory device 100 of FIG. 1 performs the sensing operation according to the degree at which the sensing node SO is discharged, due to the limit of the amount of current that may flow through the memory device 100 of FIG. 1, there may be a problem in that the potential of the first bit line BL1 might not be increased. In addition, when sensing memory cells programmed in a low state, bouncing of the source line SL may occur as a current flows from the first bit line BL1 to the source line SL.

Therefore, due to the above problem, in the present disclosure, a method of performing a sensing operation based on the degree at which the sensing node is charged after discharging the bit line and the sensing node is presented.

Figure 6:
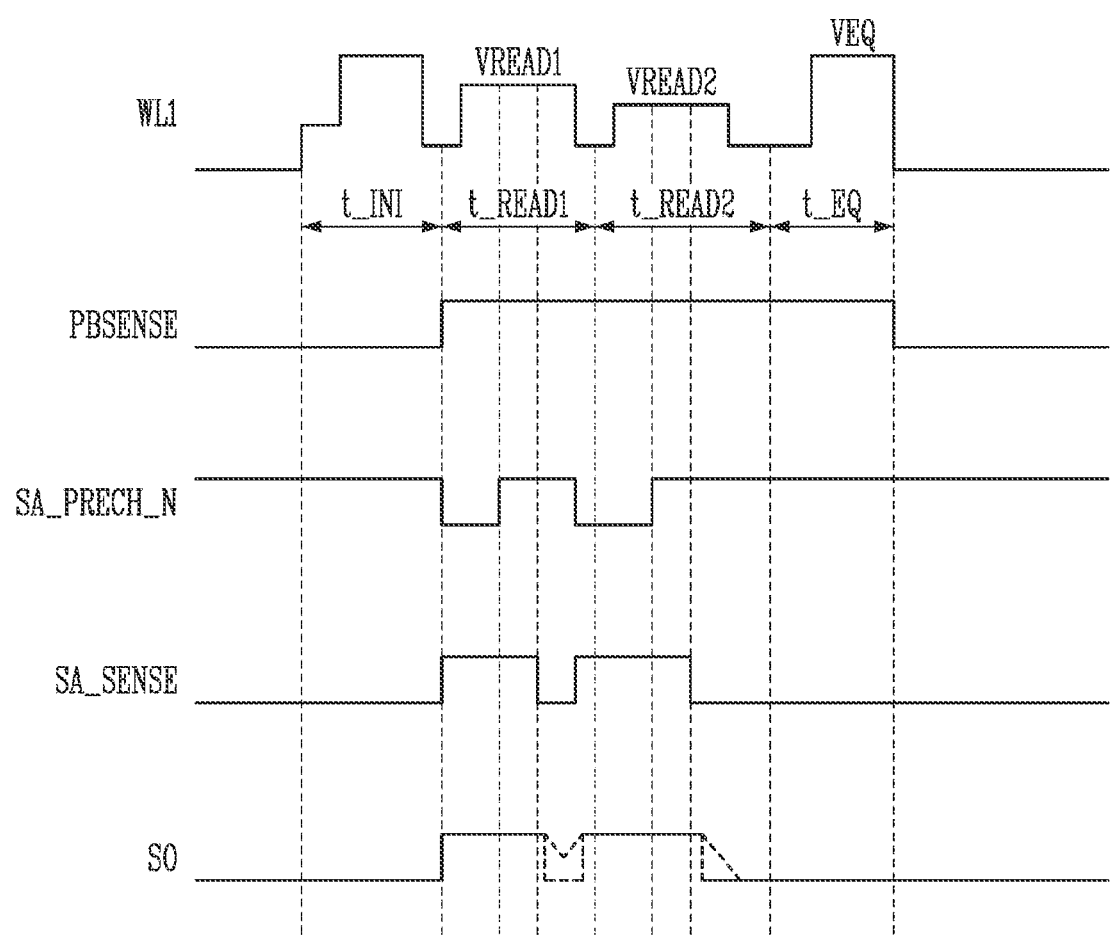
FIG. 6 is a timing diagram illustrating a magnitude change of each signal during the sensing operation of FIGS. 5A and 5B.

FIG. 6 is a timing diagram illustrating a magnitude change of each signal during the sensing operation of FIGS. 5A and 5B.

Referring to FIGS. 5A and 5B and 6, FIG. 6 shows a change of the voltage applied to the first word line WL1, the PBSENSE signal applied to the gate of the first transistor M1 connected between the first bit line BL1 and the fifth transistor M5, the SA_PRECH_N signal applied to the gate of the fourth transistor M4 connected between the sensing node SO and the VCORE power, the SA_SENSE signal applied to the gate of the fifth transistor M5 connected between the first transistor M1 and the sensing node SO, and the potential of the sensing node SO during the sensing operation of FIGS. 5A and 5B.

The sensing operation of FIGS. 5A, 5B and 6 may be the operation performed based on the discharge degree of the sensing node SO.

It is assumed that the sensing operation described in FIG. 6 is the read operation. At this time, it is assumed that a read operation performed with a first read voltage VREAD1 is a first read operation, and a read operation performed with a second read voltage VREAD2 is a second read operation.

In an embodiment, before the sensing operation on the selected memory cell, the memory device 100 of FIG. 1 lay initialize the first word line WL1 to which the selected memory cell is connected during a t_INI time. When initializing the first word line WL1, a voltage level applied to the first word line WL1 may sequentially increase from 0V (ground voltage) and decrease.

In addition, before performing the sensing operation, since the first, fourth and fifth transistors M1, M4, and M5 of FIGS. 5A and 5B are in a turned-off state, the PBSENSE signal and the SA_SENSE signal may be in a low state, and the SA_PRECH_N may be in a high state.

Thereafter, during a t_READ1 time, the first read operation may be performed with the first read voltage VREAD1. For example, the first read voltage VREAD1 may be applied to the first word line WL1 to determine whether the selected memory cell is programmed.

In an embodiment, before the first read voltage VREAD1 is applied to the first word line WL1, an operation for precharging the first bit line BL1 may be performed. For example, in order to precharge the first bit line BL1, the PBSENSE signal may be changed from a low state to a high state. At this time, the magnitude of the PBSENSE signal may be set to 0.4+VT (the magnitude of the threshold voltage of the first transistor M1). When the PBSENSE signal is changed from the low state to the high state, the first transistor M1 may be turned on, and thus the first bit line BL1 may be precharged. At this time, a precharge level of the first bit line BL1 may be 0.4.

In an embodiment, after the first bit line BL1 is precharged, in order to connect the first bit line BL1 and the sensing node SO, the PBSENSE signal may maintain the high state. When all sensing and equalizing operations are ended, the PBSENSE signal may be changed from the high state to the low state.

In an embodiment, before the first read voltage VREAD1 is applied to the first word line WL1, an operation for precharging the sensing node SO may be performed. For example, the memory device 100 of FIG. 1 may turn on the fourth transistor M4 to precharge the sensing node SO to the VCORE level. In order to turn on the fourth transistor M4, the SA_PRECH_N signal may be changed from a high state to a low state.

When the SA_PRECH_N signal becomes the low state and thus the fourth transistor is turned on, the sensing node SO may be precharged to the VCORE level. Thereafter, the memory device 100 of FIG. 1 may turn off the fourth transistor M4 so that the potential of the sensing node SO may be changed from the VCORE level according to the sensed data. In order to turn off the fourth transistor M4, the SA_PRECH_N signal may be changed from the low state to the high state again during the sensing operation.

In an embodiment, before the first read voltage VREAD1 is applied to the first word line WL1, in order to connect the first bit line BL1 and the sensing node SO, the fifth transistor M5 may be turned on. In order to turn on the fifth transistor M5, the SA_SENSE signal may be changed from a low state to a high state.

The SA_SENSE signal may maintain the high state only while sensing data, and when the sensed data is stored in the first latch 190_1 after the data is sensed, the SA_SENSE signal may be in the low state. That is, by turning off the fifth transistor M5, the data sensed according to a potential change of the sensing node SO may be stored in the first latch 190_1, and the SA_SENSE signal may be changed from the high state to the low state so that the data sensed at this time is stored in the first latch 1901.

Therefore, the first bit line BL1 and the sensing node SO may be connected to each other only while sensing data, and when the sensed data is stored in the first latch 190_1, the first bit line BL1 and the sensing node SO might not be connected.

In an embodiment, the potential of the sensing node SO may be decreased by a specific magnitude from the VCORE according to the sensed data. For example, the potential of the sensing node SO may be decreased by a relatively greater magnitude when the sensed data is in the erase state or the state in which the program is not yet completed than when the sensed data is programmed data. The memory device 100 of FIG. 1 may determine whether or not the memory cell is programmed according to a degree at which the potential of the sensing node SO is decreased from the VCORE.

In an embodiment, after the first read operation is ended, the second read operation may be performed during a t_READ2 time. The second read operation may be an operation of sensing data by applying the second read voltage VREAD2 to the first word line WL1 which is the selected word line. In an embodiment, the second read voltage VREAD2 may be less than the first read voltage VREAD1.

In an embodiment, before the second read operation is performed, an operation for precharging the first bit line BL1 and the sensing node SO may be performed. Similarly to before the first read operation is performed, the SA_PRECH_N signal may be changed from the high state to the low state, and the SA_SENSE signal may be changed from the low state to the high state.

Thereafter, the second read operation may be performed identically to the first read operation, and data sensed by the second read voltage VREAD2 may be stored in the first latch 190_1.

When the second read operation is ended, an equalizing voltage VEQ may be applied to the first word line WL1 during a t_EQ time, and an equalizing operation may be performed. Here, the equalizing operation may be an operation of simultaneously discharging all word lines. In order to perform the equalizing operation, when the equalizing voltage VEQ is applied to the first word lines WL1, a potential of the unselected word line except for the first word line WL1 may be identically set to the equalizing voltage VEQ. Thereafter, the sensing operation may be ended after all word lines are discharged. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Figure 7:
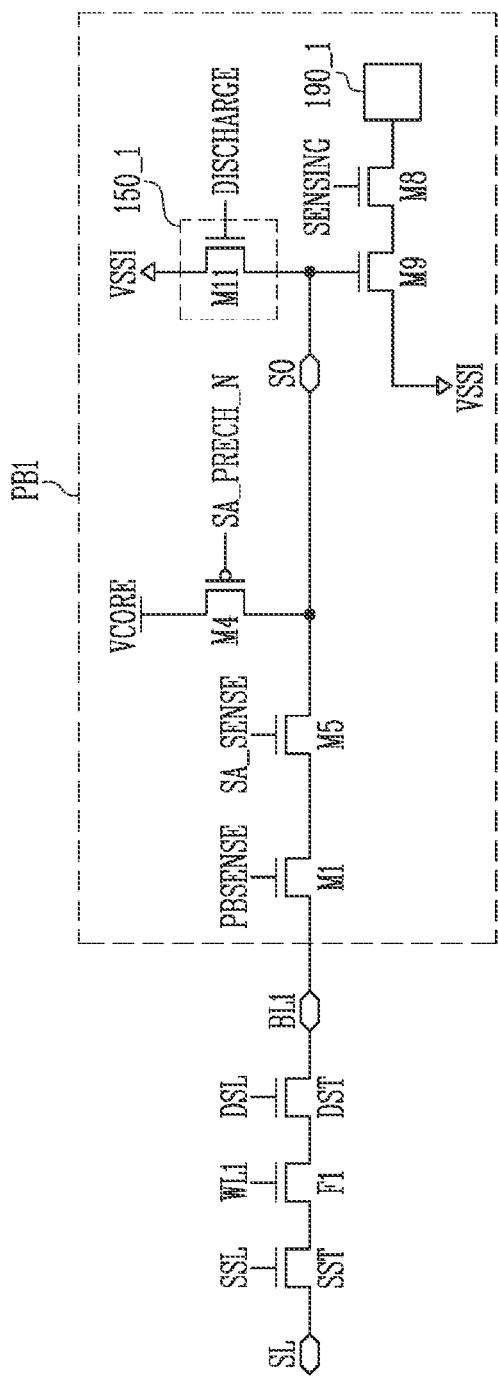
FIGS. 7A and 7B illustrate a circuit configuration and magnitudes of signals when a sensing operation is performed based on a charge degree of a sensing node.

FIGS. 7A and 7B illustrate a circuit configuration and magnitudes of signals when a sensing operation is performed based on a charge degree of a sensing node.

Referring to FIGS. 3, 4, 7A and 7B, FIG. 7A shows the transistors connected between the source line SL and the first bit line BL1 based on the first bit line BL1, and a portion of the configuration of the first page buffer PB1 connected through the first bit line BL1, and FIG. 7B shows the magnitude of the signal applied to the transistors of FIG. 7A, and a potential of each node.

In FIG. 7A and FIG. 7B, the voltages applied to the source select line SSL, the first word line WL1, and the drain select line DSL may be generated by the voltage generator 122 of FIG. 2 according to the operation signal OPSIG output from the control logic 130 of FIG. 2. That is, the voltage generator 122 of FIG. 2 may generate various operation voltages used for the sensing operation in response to the operation signal OPSIG.

Furthermore, in the present drawing, in order to perform the sensing operation based on the degree at which the sensing node SO is charged, differently from FIGS. 5A and 5B, the control logic 130 of FIG. 2 may include the sensing node charge controller 170. In order to perform the sensing operation based on the degree at which the sensing node SO is charged, the sensing node charge controller 170 may precharge the source line SL. In addition, the sensing node charge controller 170 may control a signal applied to a gate of an eleventh transistor M11.

Furthermore, identically to FIGS. 5A and 5B, the PBSENSE signal and the SA_PRECH_N signal may be generated by the voltage generator 122 of FIG. 2 according to the operation signal OPSIG output from the control logic 130 of FIG. 2.

In FIG. 7A, the memory device 100 of FIG. 1 may perform the sensing operation based on the degree at which the sensing node SO is charged. That is, according to a degree at which the sensing node SO is increased from 0V (ground voltage), the selected memory cell to be sensed may be sensed to the program state or the erase state.

During the sensing operation, when the threshold voltage of the selected memory cell is lower than the read voltage, the selected memory cell may be turned on, and when the threshold voltage of the selected memory cell is higher than the read voltage, the selected memory cell may be turned off. In an embodiment, when the selected memory cell is turned off, it may be determined that the selected memory cell is in the program state, and when the selected memory cell is turned on, it may be determined that the selected memory cell is in the erase state.

Figure 8:
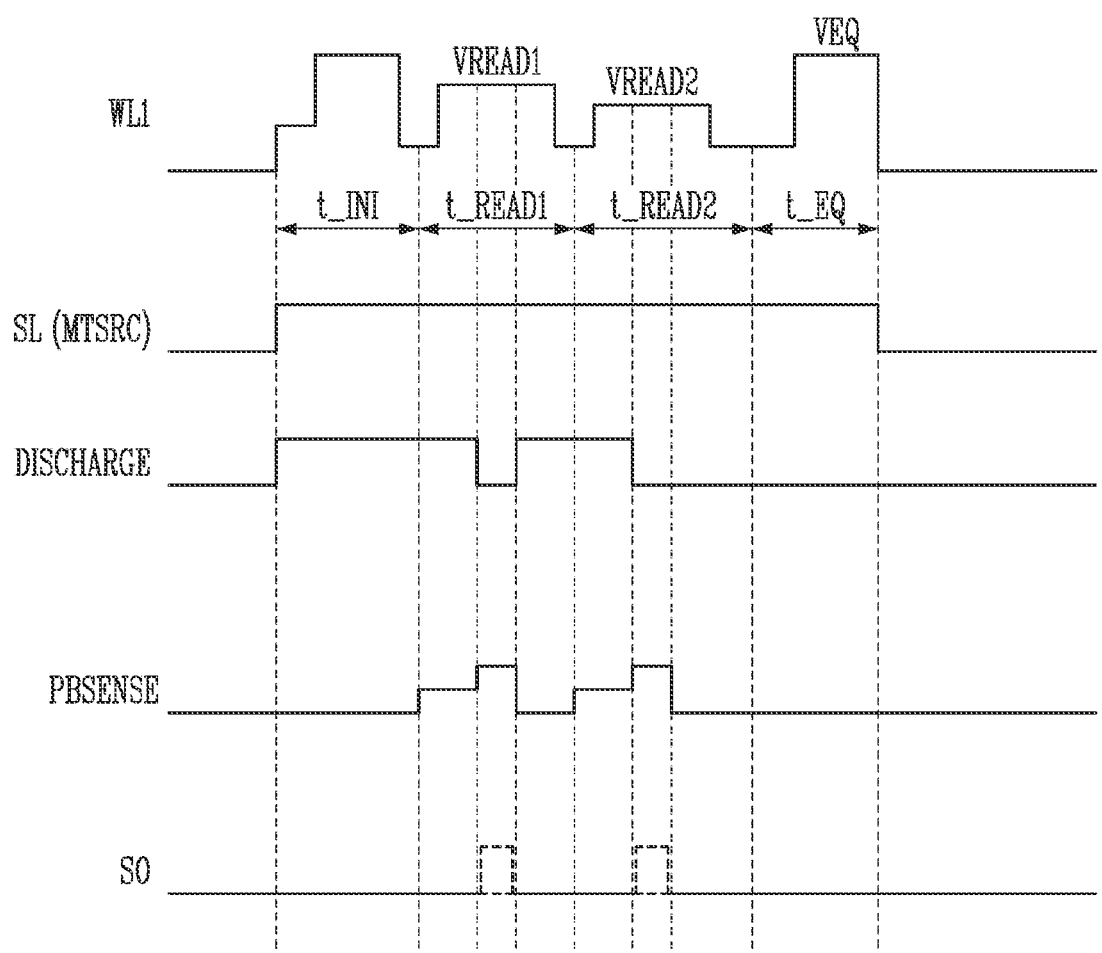
FIG. 8 is a time diagram illustrating a magnitude change of each signal during the sensing operation of FIGS. 7A and 7B.

Referring to FIGS. 7A, 7B and 8, apart from FIGS. 5A and 5B, the first page buffer PB1 of FIG. 7A may further include a first sensing node discharge circuit 150_1.

In an embodiment, the first sensing node discharge circuit 150_1 may be configured of an NMOS or PMOS transistor, but in the present drawing, it is assumed that the first sensing node discharge circuit 150_1 is configured of an NMOS transistor. Therefore, the first sensing node discharge circuit 150_1 of FIG. 7A may be configured of the eleventh transistor M11, which is an NMOS transistor. In an embodiment the eleventh transistor M11 may be coupled between the internet power voltage VSSI and the sensing node SO.

In FIG. 7A, it is assumed that the first memory cell F1 among the plurality of memory cells F1 to F16 connected to the string ST of FIG. 4 is the selected memory cell. That is, the sensing operation may be performed on the first memory cell F1 which is the selected memory cell. In addition, in FIG. 7A, it is assumed that the second to sixteenth memory cells F2 to F16, unselected memory cells among the plurality of memory cells F1 to F16, are omitted form FIG. 7A. The first memory cell F1 may be connected to the first page buffer PB1 through the first bit line BL1. It is assumed that a portion of the configuration of the first page buffer PB1 of FIG. 7A is omitted from FIG. 7A.

It is assumed that the sensing operation described in the present drawing is the read operation.

Hereinafter, content repetitive to that of FIGS. 5A and 5B is omitted.

Since the first page buffer PB1 of FIG. 7A further includes the first sensing node discharge circuit 150_1, before the sensing operation is performed in the present drawing, the first sensing node discharge circuit 150_1 may discharge the sensing node SO. In order to discharge the sensing node SO, the DISCHARGE signal applied to a gate of the eleventh transistor M11 may be changed from a low state to a high state. At this time, a magnitude of the DISCHARGE signal for turning on the eleventh transistor frill may be VDISCHARGE.

Thereafter, the sensing node SO may be discharged, and thus the potential of the sensing node SO may become 0V. When the sensing node SO is discharged, the first sensing node discharge circuit 150_1 may be separated from the sensing node SO. For example, the DISCHARGE signal applied to the gate of the eleventh transistor M11 may be 0V. That is, as the DISCHARGE signal is changed from the high state to the low state, the eleventh transistor M11 may be turned off. When the sensing operation is performed again after the eleventh transistor M11 is turned off, the DISCHARGE signal may be changed from the low state to the high state again, and the eleventh transistor M11 may be turned on.

Referring to FIG. 7B, when the memory device 100 of FIG. 1 performs the sensing operation on the first memory cell F1 which is the selected memory cell, the read voltage VREAD may be applied to the first word line WL1 to which the first memory cell F1 is connected. At this time, in order to sense the first memory cell F1, the VDSL voltage for turning on the drain select transistor DST may be applied the drain select line DSL connecting the gate of the drain select transistor DST connected to the first memory cell F1. In addition, the VSSL voltage for turning on the source select transistor SST may be applied to the source select line SSL connecting the gate of the source select transistor SST connected to the first memory cell F1.

However, apart from FIG. 5B, in FIG. 7B, the potential of the source line SL may be set to the VCORE. As the potential of the source line SL is set to the VCORE, a current may flow from the source line SL to the first bit line BL1.

In an embodiment, the magnitude of the PBSENSE signal applied to the gate of the first transistor M1 may be the threshold voltage magnitude VT. For example, a current path may be formed so that the current flows from the source line SL to the first bit line BL1. In order to form the current path, the first transistor M1 may be turned on, and at this time, a PBSENSE signal corresponding to the threshold voltage magnitude VT of the first transistor M1 may be applied to the gate of the first transistor M1.

Thereafter, when the current path is formed from the source line SL to the first bit line BL1, the magnitude of the PBSENSE signal may be increased from the threshold voltage magnitude VT to the threshold voltage magnitude VT+VCORE. That is, the voltage for turning on the first transistor M1 may be increased so that a sufficient amount of current may flow through the current path.

As the magnitude of the PBSENSE signal is increased, the potential of the sensing node SO may gradually be charged from 0V. For example, according to whether the selected memory cell is programmed, the potential of the sensing node SO may be charged from 0V to the VCORE.

When the selected memory cell is in the program state, the potential of the sensing node SO may be charged less, and when the selected memory cell is in the erase state, the potential of the sensing node SO may be charged more. That is, the potential of the sensing node SO may be charged relatively more when the selected memory cell is in the erase state than when the selected memory cell is in the program state.

As a result, in the present disclosure, the selected memory cell may be sensed from the program state or the erase state according to the charge degree of the sensing node SO, Since the selected memory cell is sensed according to the charge degree of the sensing node SO, a potential of the first bit line BL1 may be increased regardless of a limit of an amount of current. In addition, as the current flows from the source line SL to the first bit line BL1, bouncing of the source line SL may be prevented.

FIG. 8 is a time diagram illustrating a magnitude change of each signal during the sensing operation of FIGS. 7A and 7B.

Referring to FIGS. 7A, 7B and 8, FIG. 8 shows changes of the voltage applied to the first word line WL1, the potential of the source line SL, the PBSENSE signal applied to the gate of the first transistor M1 connected between the first bit line BL1 and the fifth transistor M5, the DISCHARGE signal applied to the gate of the eleventh transistor M11 connected to the sensing node, and the potential of the sensing node SO during the sensing operation of FIGS. 7A and 7B.

The sensing operation of FIGS. 7A, 7B and 8 may be the operation performed based on the charge degree of the sensing node SO.

It is assumed that the sensing operation described in FIG. 8 is the read operation. At this time, it is assumed that the read operation performed with the first read voltage VREAD1 is the first read operation, and the read operation performed with the second read voltage VREAD2 is the second read operation.

Referring to FIGS. 6 and 8, in FIGS. 6 and 8, since the voltage applied to the first word line WL1 and signals and potentials which are not shown in the present drawing are the same, a description of repetitive contents is omitted.

In an embodiment, before the sensing operation on the selected memory cell, the potential of the source line SL may be increased to the VCORE level. That is, the potential of the source line SL may be set to the VCORE so that the current path is formed from the source line SL to the first bit line BL1. Since the current path from the source line SL to the first bit line BL1 is required to be formed until the sensing operation is ended, the potential of the source line SL may be set to the VCORE.

In an embodiment, before the sensing operation on the selected memory cell, the DISCHARGE signal may be changed from a low state to a high state in order to perform the sensing operation based on the charge degree of the sensing node SO. That is, in order to turn on the eleventh transistor M11 connected to the sensing node SO, the VDISCHARGE voltage may be applied to the gate of the eleventh transistor M11. When the eleventh transistor M11 is turned on, the sensing node SO may be discharged, and thereafter, the sensing operation may be performed based on the degree at which the sensing node SO is charged.

Thereafter, during a t_READ1 time, the first read operation may be performed with the first read voltage VREAD1. For example, the first read voltage VREAD1 may be applied to the first word line WL1 to determine whether the selected memory cell is programmed.

In an embodiment, before the first read voltage VREAD1 is applied to the first word line WL1, an operation of forming a current path may be performed so that the current flows from the source line SL to the first bit line BL1. For example, the PBSENSE signal may be set to a magnitude corresponding to the threshold voltage magnitude VT of the first transistor M1.

When the PBSENSE signal is set to the magnitude corresponding to the threshold voltage magnitude VT of the first transistor M1 and thus the current flows from the source line SL to the first bit line BL1, that is, when the current path is formed, the voltage for turning on the first transistor M1 may be increased so that a sufficient amount of current may flow through the current path.

In an embodiment, during the sensing operation on the selected memory cell, while the voltage for turning on the first transistor M1 is increased, the DISCHARGE signal may be set to 0V, That is, by turning off the eleventh transistor M11 connected to the sensing node SO, the sensing node SO may be sequentially charged at 0V (ground voltage), and the selected memory cell may be sensed according to the degree at which the sensing node SO is charged.

In an embodiment, the potential of the sensing node SO may be increased by a specific magnitude from 0V according to the sensed data. For example, the potential of the sensing node SO may be charged to a relatively greater magnitude when the sensed data is in the erase state or the state in which the program is not yet completed than when the sensed data is programmed data. The memory device 100 of FIG. ay determine whether or not the memory cell is programmed according to a degree at which the potential of the sensing node SO is increased from 0V.

In an embodiment, after the first read operation is ended, the second read operation may be performed during a t_READ2 time. The second read operation may be an operation of sensing data by applying the second read voltage VREAD2 to the first word line WL1 which is the selected word line. In an embodiment, the second read voltage VREAD2 may be less than the first read voltage VREAD1.

In an embodiment, similarly to before performing the first read operation, before performing the second read operation, in order to discharge the sensing node SO, the VDISCHARGE voltage may be applied to the gate of the eleventh transistor M11, In addition, the PBSENSE signal may be set to the magnitude corresponding to the threshold voltage magnitude VT of the first transistor M1, and thus the current may flow from the source line SL to the first bit line BL1.

Thereafter, the second read operation is performed identically to the first read operation, and data sensed by the second read voltage VREAD2 may be stored in the first latch 190_1.

As a result, during the first and second read operations, the data may be sensed based on the charged degree of the sensing node SO, and the sensed data may be stored in the latch.

Figure 9:
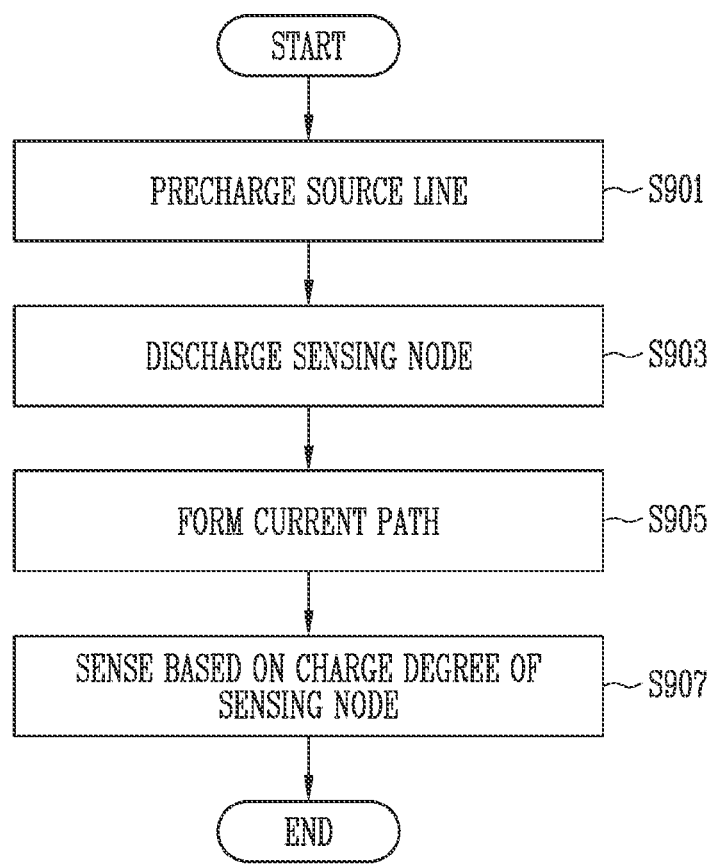
FIG. 9 is a diagram illustrating an operation of a memory device according to an embodiment of the present disclosure.

FIG. 9 is a diagram illustrating an operation of a memory device according to an embodiment of the present disclosure.

Referring to FIG. 9, in step S901, before performing the sensing operation, the memory device may precharge the source line. For example, the source line may be precharged so that the current flows from the source line to the bit line.

In step S903, the memory device may discharge the sensing node. In the present disclosure, since the sensing operation is performed based on the charged degree of the sensing node, an operation for discharging the sensing node may be performed. For example, a transistor connected to the sensing node may be turned on, and the sensing node may be discharged.

In step S905, after the sensing node is discharged, a current path may be formed. At this time, the current path may mean the flow of the current flowing from the source line to the bit line.

First, when the sensing node is discharged, a signal of a threshold voltage of a corresponding transistor may be applied to a gate of the transistor connected to the bit line, and the current path may be formed as the transistor connected to the bit line is turned on.

In an embodiment, after the sensing node is discharged, a signal of a magnitude greater than the threshold voltage of the corresponding transistor may be applied to the gate of the transistor connected to the bit line so that a sufficient current flows from the source line to the bit line.

In step S907, the memory device may sense data based on the charge degree of the sensing node. For example, after the sensing node is discharged, the sensing node may be charged as the current path is formed. At this time, since the charged degree varies according to the sensed data, the memory device may sense the data according to the charge degree of the sensing node.

Figure 10:
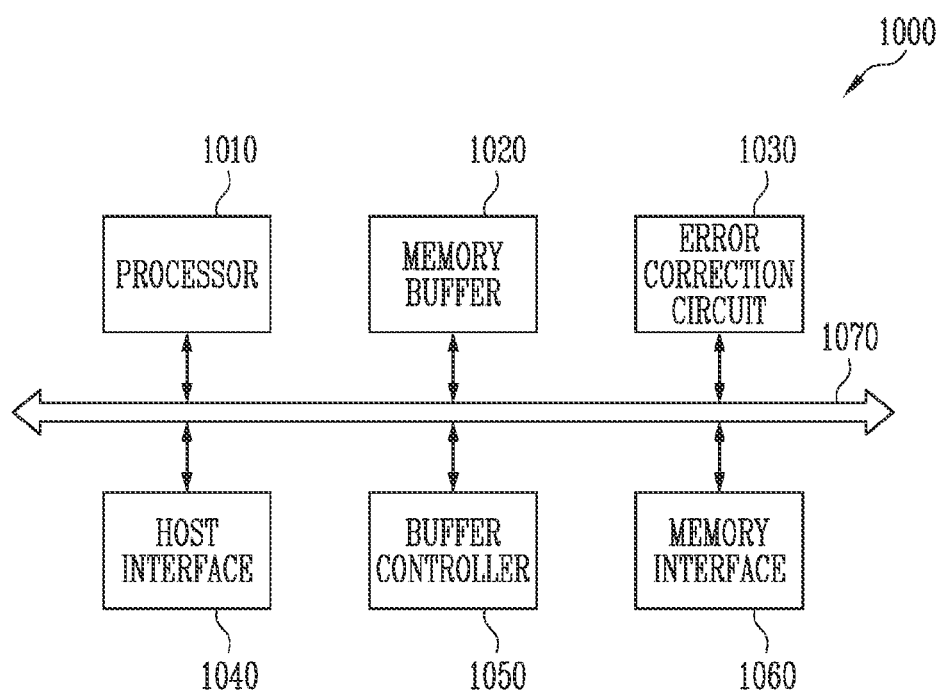
FIG. 10 is a diagram illustrating another embodiment of a memory controller of FIG. 1.

FIG. 10 is a diagram illustrating another embodiment of the memory controller of FIG. 1.

The memory controller 1000 is connected to a host and the memory device. The memory controller 1000 is configured to access the memory device in response to the request from the host Host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 10, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000. The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010, The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1020, and the memory interface 1060.

Figure 11:
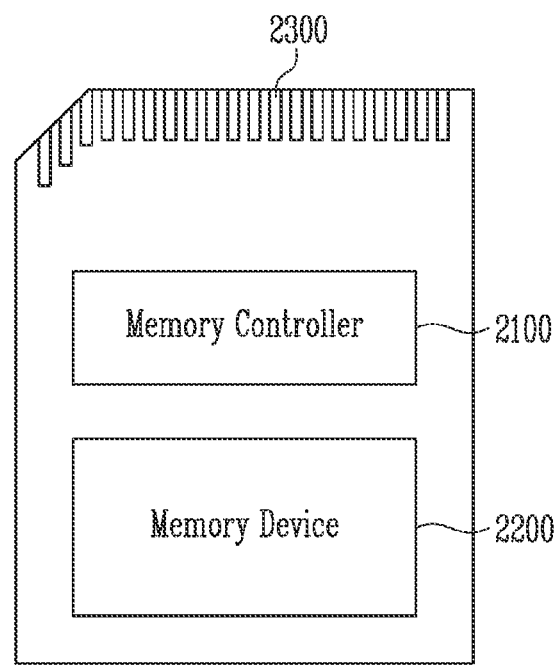
FIG. 11 is a block diagram illustrating a memory card system to which a storage device according to an embodiment of the present disclosure is applied.

FIG. 11 is a block diagram illustrating a memory card system to which the storage device according to an embodiment of the present disclosure is applied.

Referring to FIG. 11, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 of FIG. 1 described with reference to FIG. 2.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented as various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, when the memory device 2200 performs the sensing operation on the selected memory cell, the memory device 2200 may perform the sensing operation according to the degree at which the sensing node in the page buffer connected to the selected memory cell through the bit line is charged.

In order to perform the sensing operation based on the degree at which the sensing node is charged, before the sensing operation, the memory device 2200 may precharge the source line and discharge the sensing node. After the sensing node is discharged, a relatively high voltage may be applied to the gate of the transistor connected to the bit line, and thus the sensing node may be sequentially charged from the ground voltage.

In an embodiment, the selected memory cell may be sensed according to the degree at which the sensing node is charged. For example, when the degree at which the sensing node is charged is equal to or greater than the reference value, the selected memory cell may be determined to be in the erase state, and when the degree at which the sensing node is charged is less than the reference value, the selected memory cell may be determined to be in the program state.

Figure 12:
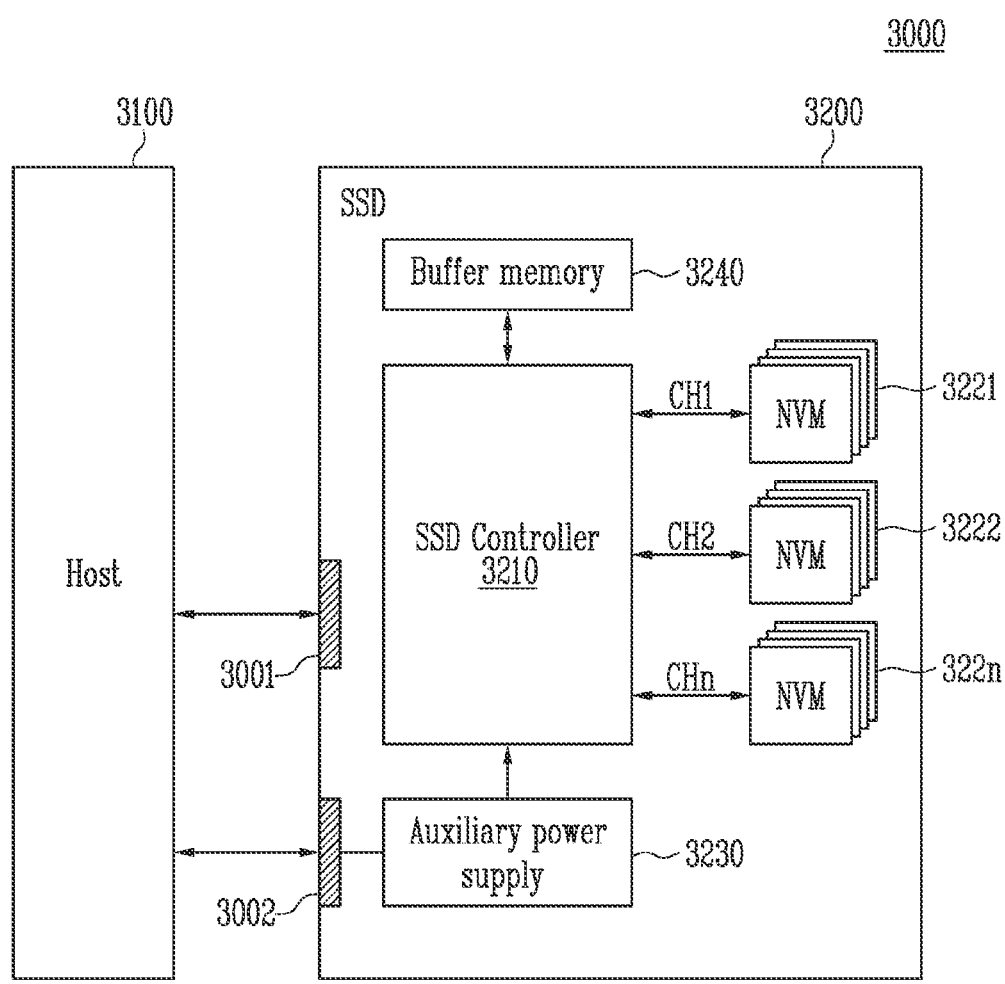
FIG. 12 is a block diagram exemplary illustrating a solid state drive (SSD) system to which a storage device according to an embodiment of the present disclosure is applied.

FIG. 12 is a block diagram illustrating, for example, a solid state drive (SSD) system to which the storage device according to an embodiment of the present disclosure is applied.

Referring to FIG. 12, the SSD system 3000 includes a host 3100 and an SSD 3200. The SSD 3200 exchanges a signal SIG with the host 3100 through a signal connector 3001 and receives power PAIR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG.

The SSD controller 3210 may control the plurality of flash memories 3221 to 322n in response to the signal SIG received from the host 3100. As an example, the signal SIG may be signals based on an interface between the host 3100 and the SSD 3200, For example, the signal SIG may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

In an embodiment, during the sensing operation on a selected memory cell among memory cells included in each of the plurality of flash memories 3221 to 322n, the plurality of flash memories 3221 to 322n may perform the sensing operation according to the degree at which the sensing node in the page buffer connected to the selected memory cell through the bit line is charged.

In order to perform the sensing operation based on the degree at which the sensing node is charged, before the sensing operation, the plurality of flash memories 3221 to 322n may precharge the source line and discharge the sensing node. After the sensing node is discharged, a relatively high voltage may be applied to the gate of the transistor connected to the bit line, and thus the sensing node may be sequentially charged from the ground voltage.

In an embodiment, the selected memory cell may be sensed according to the degree at which the sensing node is charged. For example, when the degree at which the sensing node is charged is equal to or greater than the reference value, the selected memory cell may be determined to be in the erase state, and when the degree at which the sensing node is charged is less than the reference value, the selected memory cell may be determined to be in the program state.

Figure 13:
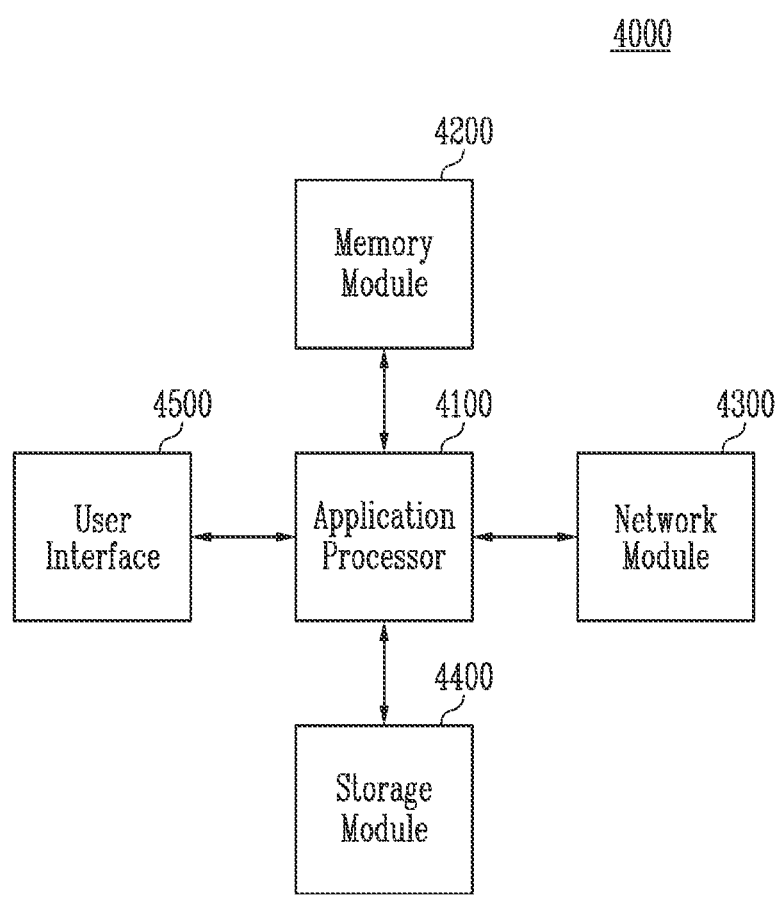
FIG. 13 is a block diagram illustrating a user system to which a storage device according to an embodiment of the present disclosure is applied.

FIG. 13 is a block diagram illustrating a user system to which the storage device according to an embodiment of the present disclosure is applied.

Referring to FIG. 13, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM, For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

In an embodiment, when the storage module 4400 performs the sensing operation on the selected memory cell, the storage module 4400 may perform the sensing operation according to the degree at which the sensing node in the page buffer connected to the selected memory cell through the bit line is charged.

In order to perform the sensing operation based on the degree at which the sensing node is charged, before the sensing operation, the storage module 4400 may precharge the source line and discharge the sensing node. After the sensing node is discharged, a relatively high voltage may be applied to the gate of the transistor connected to the bit line, and thus the sensing node may be sequentially charged from the ground voltage.

In an embodiment, the selected memory cell may be sensed according to the degree at which the sensing node is charged. For example, when the degree at which the sensing node is charged is equal to or greater than the reference value, the selected memory cell may be determined to be in the erase state, and when the degree at which the sensing node is charged is less than the reference value, the selected memory cell may be determined to be in the program state.

What is claimed is:

1. A memory device comprising:
 a memory cell array including a plurality of memory cells;
 a peripheral circuit including a page buffer connected to a selected memory cell among the plurality of memory cells through a bit line, and configured to perform a sensing operation on the selected memory cell; and
 a control logic configured to control the peripheral circuit to precharge a source line among lines connected to the memory cell array and perform the sensing operation based on a degree at which a sensing node in the page buffer is charged, during the sensing operation,
 wherein the control logic controls the peripheral circuit to turn on a first transistor connected to a current path which is formed from the source line to the bit line, among transistors included in the page buffer.

2. The memory device of claim 1, wherein the page buffer includes a sensing node charge controller connected to the sensing node to discharge the sensing node.

3. The memory device of claim 2, wherein the sensing node charge controller discharges the sensing node after receiving a sensing command from outside before the sensing operation corresponding the sensing command.

4. The memory device of claim 3, wherein the sensing node charge controller is disabled when the sensing operation is started after the sensing node is discharged.

5. The memory device of claim 2, wherein the sensing node charge controller is configured of an NMOS transistor or a PMOS transistor.

6. The memory device of claim 1, wherein the sensing node is sequentially charged from a ground voltage.

7. The memory device of claim 1, wherein when a threshold voltage of the selected memory cell is lower than a sensing voltage, the sensing node is charged more than when the threshold voltage of the selected memory cell is higher than the sensing voltage.

8. The memory device of claim 7, wherein when the degree at which the sensing node is charged is equal to or greater than a reference value, the selected memory cell is in an erase state, and
 when the degree at which the sensing node is charged is less than the reference value, the selected memory cell is in a program state.

9. The memory device of claim 1, wherein the control logic controls the page buffer to form the current path before the sensing operation.

10. The memory device of claim 9, wherein the control logic controls the peripheral circuit to generate a voltage signal equal to a threshold voltage of the first transistor.

11. The memory device of claim 10, wherein the control logic controls the peripheral circuit to generate a voltage signal higher than the threshold voltage of the first transistor after the first transistor is turned on.

12. A method of operating a memory device, the method comprising:
 precharging a source line among lines connected to a memory cell array;
 applying a sensing voltage to a selected word line connected to a selected memory cell included in the memory cell array among the lines; and
 sensing the selected memory cell based on a degree at which a sensing node in a page buffer connected to the selected memory cell through a bit line is charged,
 wherein precharging the source line comprises:
 turning on a first transistor connected to a current path which is formed from the source line to the bit line, among transistors included in the page buffer; and
 forming the current path.

13. The method of claim 12, wherein precharging the source line comprises discharging the sensing node using a sensing node charge controller connected to the sensing node.

14. The method of claim 13, wherein in applying the sensing voltage, when the sensing node is discharged, the sensing node charge controller is disabled.

15. The method of claim 12, wherein in sensing the selected memory cell, the sensing node is sequentially charged from a ground voltage.

16. The method of claim 12, wherein in sensing the selected memory cell, when a threshold voltage of the selected memory cell is lower than a sensing voltage, the sensing node is charged more than when the threshold voltage of the selected memory cell is higher than the sensing voltage.

17. The method of claim 16, wherein in sensing the selected memory cell, when the degree at which the sensing node is charged is equal to or greater than a reference value, the selected memory cell is determined to be in an erase state, and when the degree at which the sensing node is charged is less than the reference value, the selected memory cell is determined to be in a program state.

18. The method of claim 12, wherein turning on the first transistor comprises:
 generating a voltage signal equal to a threshold voltage of the first transistor; and
 applying the voltage signal equal to the threshold voltage of the first transistor to a gate of the first transistor.

19. The method of claim 18, wherein forming the current path further comprises:
 generating a voltage signal higher than the threshold voltage of the first transistor after the first transistor is turned on; and
 applying the voltage signal higher than the threshold voltage of the first transistor to the gate of the first transistor.

* * * * *